United States Patent
Mishima et al.

(10) Patent No.: US 6,864,424 B2
(45) Date of Patent: Mar. 8, 2005

(54) ELECTRONIC COMPONENT AND PACKAGE

(75) Inventors: Naoyuki Mishima, Yokohama (JP); Satoshi Ichikawa, Otawara (JP); Takamasa Oto, Itami (JP)

(73) Assignees: Fujitsu Media Devices Limited, Yokohama (JP); Fujimaru Industry Co., Ltd., Itami (JP)

(*) Notice: Subject to any disclaimer, the term of this patent is extended or adjusted under 35 U.S.C. 154(b) by 0 days.

(21) Appl. No.: 10/852,311

(22) Filed: May 25, 2004

(65) Prior Publication Data

US 2004/0238928 A1 Dec. 2, 2004

(30) Foreign Application Priority Data

May 30, 2003 (JP) .......................................... 2003-153923

(51) Int. Cl.[7] .............................................. H01L 23/02
(52) U.S. Cl. ...................... 174/52.4; 174/52.3; 257/699
(58) Field of Search ............................... 174/52.2, 52.3, 174/52.4; 257/698, 699

(56) References Cited

U.S. PATENT DOCUMENTS

| | | | | |
|---|---|---|---|---|
| 4,864,470 A | * | 9/1989 | Nishio .......................... 361/760 |
| 5,235,135 A | * | 8/1993 | Knecht et al. .............. 174/52.3 |
| 5,438,305 A | * | 8/1995 | Hikita et al. ................... 333/32 |
| 5,545,849 A | * | 8/1996 | Kondo ........................ 174/52.4 |
| 5,872,331 A | * | 2/1999 | Ando et al. ................ 174/35 R |
| 6,105,226 A | * | 8/2000 | Gore et al. ................. 29/25.35 |
| 6,372,985 B1 | * | 4/2002 | Shimoe ....................... 174/52.4 |
| 6,487,085 B1 | * | 11/2002 | Kimura et al. .............. 361/763 |
| 6,518,501 B1 | * | 2/2003 | Kawahara et al. ......... 174/52.4 |
| 6,777,612 B2 | * | 8/2004 | Sugiura et al. ............. 174/52.4 |

FOREIGN PATENT DOCUMENTS

| | | |
|---|---|---|
| JP | 7-336186 | 12/1995 |
| JP | 2001-60842 | 3/2001 |

* cited by examiner

*Primary Examiner*—Hung V. Ngo
(74) *Attorney, Agent, or Firm*—Arent Fox PLLC

(57) ABSTRACT

An electronic component includes: a package that includes a metal portion formed by pressing a metal, and an insulating portion attached to the metal portion through fusing; a chip housed in the package; first external terminals that are electrically connected to the chip with metal wires, and are partially embedded in the insulating portion; and ground terminals that are convexities of metal portion and are electrically connected to the chip with metal wires, connecting points between the first external terminals and the chip being located at the same height as connecting points between the ground terminals and the chip.

11 Claims, 7 Drawing Sheets

ELECTRONIC COMPONENT AND PACKAGE

BACKGROUND OF THE INVENTION

1. Field of the Invention

The present invention generally relates to a package and an electronic component that has a package structure hermetically sealing a chip, and more particularly, to a package and an electronic component that has a package structure suitable for improving electrical characteristics such as stop-band attenuation of a filter device such as a surface acoustic wave device.

2. Description of the Related Art

Conventionally, surface acoustic wave devices (hereinafter referred to simply as SAW devices) have been used as electronic components each having a package in which a chip is hermetically sealed. A conventional SAW device normally includes a SAW device chip having a SAW element formed on a piezoelectric substrate, and a package in which the SAW device chip is hermetically sealed.

Such SAW devices are widely used in filter devices and oscillators of television (TV) receivers, videotape recorders (VTRs), DVD (Digital Versatile Disk) recorders, and cellular phone devices. More specifically, SAW devices are widely used in various kinds of circuits that process radio signals in frequency bands of 45 MHz to 2 GHz. Such circuits include transmission band-pass filters, reception band-pass filters, local oscillation filters, antenna duplexers, intermediate frequency filters, and frequency modulators.

As those signal processing apparatuses have dramatically become smaller in size in recent years, there is an increasing demand for smaller electronic components such as SAW devices to be employed in those apparatuses. Especially, surface-mounted type SAW devices that are low in height are strongly required for portable electronic devices such as cellular phone devices.

So as to perform surface-mounting of a SAW device, a package structure made of ceramics is normally used. Such a package structure is disclosed in Japanese Unexamined Patent Publication No. 7-336186, for example. If the package size is large, however, a ceramic package is likely to be expensive.

Meanwhile, a less expensive package that is not made of ceramics has also been suggested, for example, in Japanese Unexamined Patent Publication No. 2001-60842. Such a package structure has a metal portion and an insulating portion. The insulating portion is formed in through holes in the metal portion, and leads for external connections are embedded in the insulating portion. A crystal oscillator to be housed in the package is supported at both ends, and is attached to the package in such a manner that oscillation is not hindered.

The package disclosed in Japanese Unexamined Patent Publication No. 2001-60842, however, is not suitable for housing a chip such as a SAW device chip that is to be wire-bonded and die-mounted onto a package, because a crystal vibrator is supported by the package at both ends.

SUMMARY OF THE INVENTION

It is therefore an object of the present invention to provide an electronic component and a package in which the above disadvantage is eliminated.

A more specific object of the present invention is to provide an electronic component and a package that can be easily wire-bonded to each other and exhibit high reliability.

The above objects of the present invention are achieved by an electronic component comprising: a package that includes a metal portion formed by pressing a metal, and an insulating portion attached to the metal portion through fusing; a chip housed in the package; first external terminals that are electrically connected to the chip with metal wires, and are partially embedded in the insulating portion; and ground terminals that are convexities of the metal portion and are electrically connected to the chip with metal wires, connecting points between the first external terminals and the chip being located at the same height as connecting points between the ground terminals and the chip.

The above objects of the present invention are also achieved by a package comprising: a metal portion formed by pressing a metal; an insulating portion that is attached to the metal portion through fusing; first external terminals that are partially embedded in the insulating portion; and ground terminals that are convexities of the metal portion, inner connecting points of the first external terminals being located at the same height as inner connecting points of the ground terminals.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

For better understanding of the present invention, comparative examples will be first described. Each of the comparative examples shows a package that includes a metal portion formed by pressing a metal and an insulating portion attached to the metal portion through fusing, and a SAW device that includes a SAW device chip die-mounted in the package.

Figure 1A:
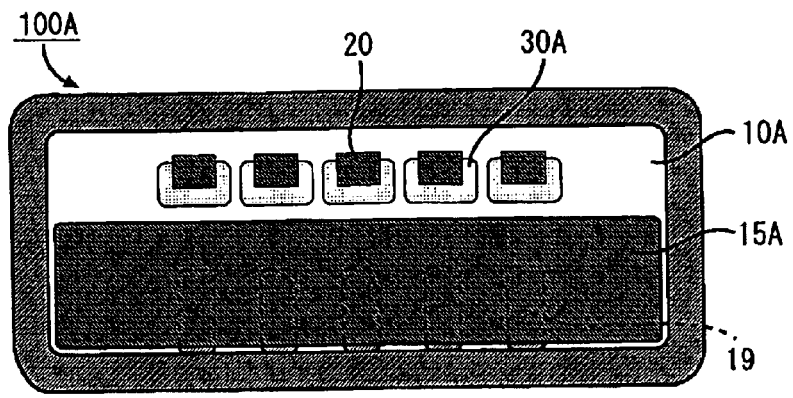
FIG. 1A is a plan view of the package of a SAW device shown as a comparative example.
Figure 1B:
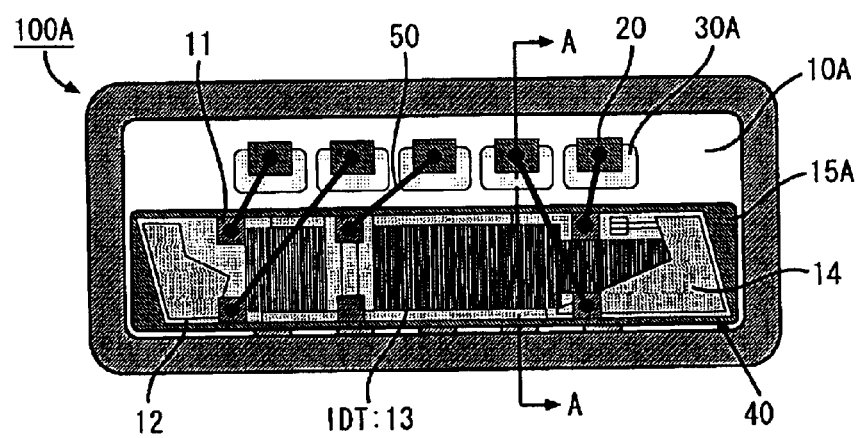
FIG. 1B is a plan view of the inside of the SAW device, seen through an outer lid.
Figure 1C:
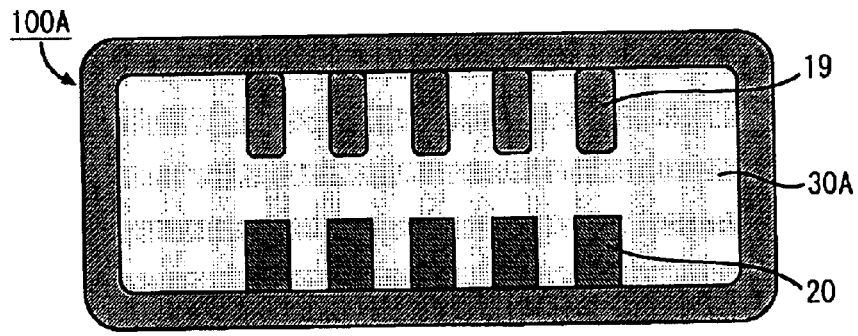
FIG. 1C is a bottom view of the SAW device as the comparative example.
Figure 1D:
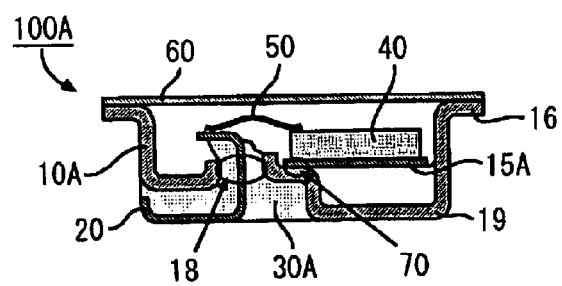
FIG. 1D is a section view of the SAW device, taken along the line A—A of FIG. 1B.

FIGS. 1A through 1D illustrate such a SAW device. FIG. 1A is a plan view of a package 100A. FIG. 1B is a plan view of the inside of the SAW device, seen through a later described plate member to serve as a lid 60. FIG. 1C is a bottom view of the SAW device. FIG. 1D is a section view of the SAW device, taken along the line A—A of FIG. 1B.

The SAW device shown in FIGS. 1A through 1D is an electronic component that includes the package 100A and a SAW device chip 40 housed in the package 100A. The package 100A has a metal portion 10A that is formed by pressing a metal, and an insulating portion 30A that is attached to the metal portion 10A through fusing. The SAW device further includes first external terminals 20 that are electrically connected to the SAW device chip 40 and are aligned and embedded in the insulating portion 30A, and a plate member 15A that supports the SAW device chip 40. The metal portion 10A has concave portions 19 that form second external terminals, and the plate member 15 is placed to cover the concave portions 19.

More specifically, the SAW device shown in FIGS. 1A through 1D includes the package 100A and the SAW device chip 40 hermetically sealed in the package 100A. The package 100A includes the metal portion 10A and the insulating portion 30A, and the SAW device chip 40 is housed in the cavity of the package 100A. The metal portion 10A is formed by pressing a metal. The metal portion 10A has a thickness of 50 μm, and forms the principal outer wall of the package 100A. The metal portion 10A also has the concave portions 19. Each of the concave portions 19 has the form of a concavity when seen from the inside of the package 100A, but has the form of a convexity when seen from the outside of the package 100A. Each of the concave portions 19 has a C-shaped section. The concave portions 19 are also formed by pressing the metal. The exterior of each of the concave portions 19 is flat so that the concave portions 19 form the areas for external connections. The concave portions 19 serve as second external terminals that will be also denoted by reference numeral 19 in the following. The second external terminals 19 are part of the package 100A, as well as part of the metal portion 10A. The second external terminals 19 are not connected directly to the SAW device chip 40, and function as the ground terminals of the package 100A. When the SAW device is mounted on the print-circuit board, the second external terminals 19 have the same potentials (the ground potential), though not being connected directly to the SAW device chip 40.

The plate member 15A may be a metal plate with a rectangular shape, and is placed to cover the concave portions 19. The plate member 15A has a joining point 70 that is welded and fixed to the inner surface (the inner wall) of the metal portion 10A of the package 10A. The plate member 15A serves to provide a flat area onto which the SAW device chip 40 is mounted (die-mounted) and bonded. The terminals on the SAW device chip 40 and the first external terminals 20 are electrically connected with metal wires 50.

The insulating portion 30A is provided on the bottom surface of the package 100A. More specifically, the insulating portion 30A is attached to the bottom surface of the package 100A through fusing and completely fill through holes 18. The insulating portion 30A slightly protrudes inward from the through holes 18.

The first external terminals 20 are embedded in the insulating portion 30A. While being embedded in the insulating portion 30A, the first external terminals 20 penetrate the aligned through holes 18. The first external terminals 20 are formed by pressing a plate-like metal, and are attached to the insulating portion 30A through fusing. One end of each of the first external terminals 20 is exposed to the inside of the cavity through each corresponding insulating portion 30A. The other end of each of the first external terminals 20 forms part of the bottom surface of the package 100A. This part of the bottom surface serves as the area for connecting to the outside. When the insulating portion 30A is attached to the metal portion 10A through fusing, the first external terminals 20 are straight. After the insulating portion 30A is attached to the metal portion 10A through fusing, however, each of the first external terminals 20 is bent. Accordingly, the inner surface of each of the first external terminals 20 is not welded to the insulating portion 30A, and there is a small gap formed between each of the first external terminals 20 and each corresponding insulating portion 30A. The connecting areas of the first external terminals 20, the exposed surfaces of the insulating portion 30A, and the concave portions 19, which are the second external terminals 19, form the bottom surface of the package 100A, or the bottom surface (the mounting surface) of the SAW device. Here, the bottom surface is generally flat.

The SAW device chip 40 has interdigital transducers (IDTs) 13 and electrode terminals 11 formed by patterning on a piezoelectric substrate 12. The SAW device chip 40 also has resin materials 14 printed thereon to reduce reflection of surface acoustic waves (SAW). The resin materials 14 are placed to cover the IDTs 13. The end surfaces of the piezoelectric substrate 12 in the SAW propagating direction each forms a predetermined angle with respect to the SAW propagating direction, so that filter characteristics deterioration due to reflection on the end surfaces of the piezoelectric substrate 12 can be prevented. Further, the IDTs 13 are designed to have such electrode finger intervals and weighting forms as to achieve desired filter characteristics. In a case where a TV intermediate frequency filter of a 30 MHz to 75 MHz band is formed as the SAW device chip 40, the size of the SAW device chip 40 is approximately 10 mm×2 mm. However, various other filters may also be employed, such as 1.9 GHz band SAW filters and 250 MHz band SAW filters.

The lid 60 is formed by pressing a metal, and is attached to a flange 16 formed along the edge of the outer wall of the package 100A. With the lid 60, the inside of the package 100A is hermetically sealed.

The metal portion 10A, the first external terminals 20, and the lid 60 of the package 100A, can be made of a metal such as an industry standard SPC material (a cold-rolled steel sheet), 42-alloy, or Kovar. Preferably, plating with nickel (Ni) or gold (Au) is performed on the surfaces of the metal portion 10A, the first external terminals 20, and the lid 60. The insulating portion 30A may be made of an insulating material such as glass or glass ceramics that can be easily attached to a metal through fusing. These materials may easily be attached and bonded to metal and enhance resistance to mechanical shock. The metal wires 50 may be Au wires or aluminum (Al) wires. The joining of the lid 60 and the flange 16 of the package 100A may be performed by resistance heat welding, seam welding, or laser welding.

The package 100A includes at least the metal portion 10A and the insulating portion 30A, but the first external terminals 20 and the lid 60 may also be considered to be part of the package 100A.

Figure 2A:
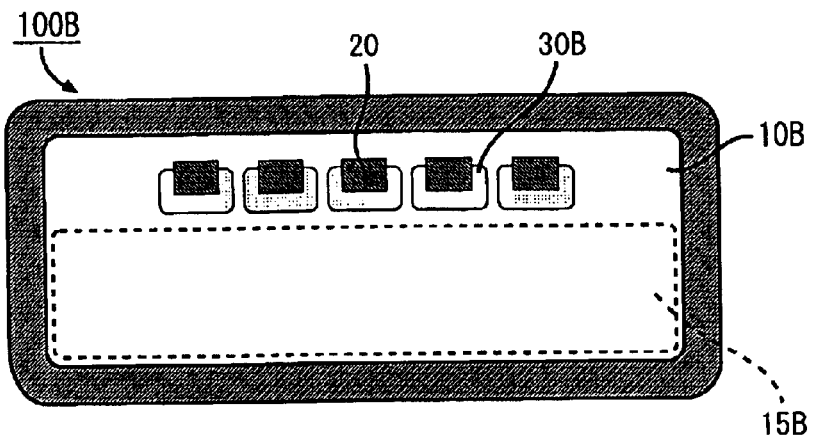
FIG. 2A is a plan view of the package of a SAW device shown as another comparative example.
Figure 2B:
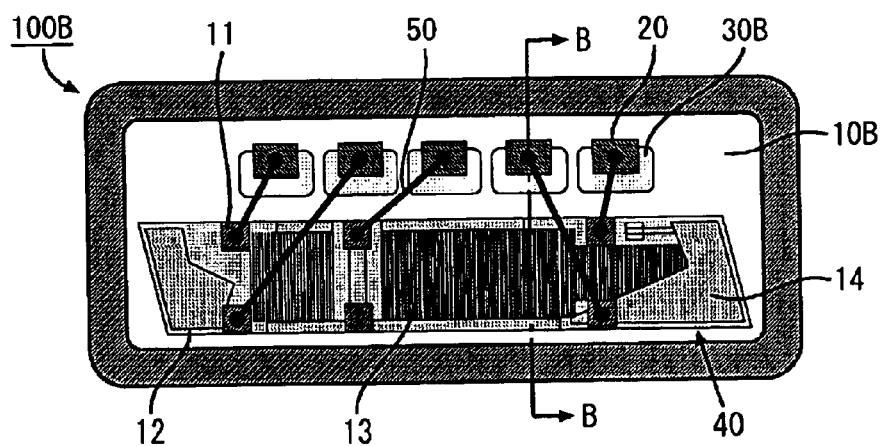
FIG. 2B is a plan view of the inside of the SAW device, seen through an outer lid.
Figure 2C:
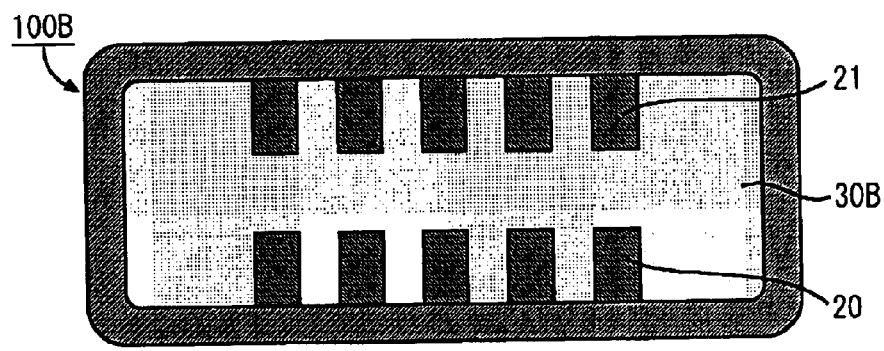
FIG. 2C is a bottom view of the SAW device as another comparative example.
Figure 2D:
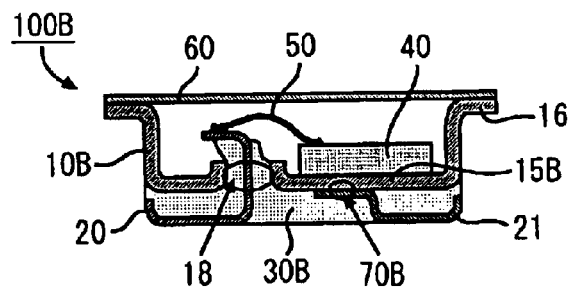
FIG. 2D is a section view of the SAW device, taken along the line B—B of FIG. 2B.

FIGS. 2A through 2D illustrate a SAW device that will now be described as another comparative example. FIG. 2A is a plan view of a package 100B. FIG. 2B is a plan view of the inside of the SAW device, seen through a lid 60. FIG. 2C is a bottom view of the SAW device. FIG. 2D is a section view of the SAW device, taken along the line B—B of FIG. 2B. In FIGS. 2A through 2D, the same components as those shown in FIGS. 1A through 1D are denoted by the same reference numerals as those in FIGS. 1A through 1D. This comparative example differs from the foregoing comparative example shown in FIGS. 1A through 1D in that the second external terminals are not formed by the metal portion of the package but are formed with a separate material from the package, and in that the SAW device chip is attached directly to the metal portion of the package.

More specifically, the SAW device shown in FIGS. 2A through 2D includes the package 100B and a SAW device chip 40 that is hermetically sealed in the package 100B. The package 100B includes a metal portion 10B and an insulating portion 30B, and the SAW device chip 40 is housed in the inner cavity of the package 100B. The metal portion 10B is formed by pressing a metal. The metal portion 10B has a thickness of 50 μm, and forms the principal outer wall of the package 100B. The metal portion 10B also has a chip mounting portion 15B that is also formed by pressing the metal. The chip mounting portion 15B has a flat outer surface onto which second external terminals 21 are attached by welding, or the like. The second external terminals 21 are not connected directly to the SAW device chip 40, and function as the ground terminals of the package 100B. Each of the second external terminals 21 has an L-shaped section, and is electrically connected to the metal portion 10B at a joining point 71. When the SAW device is mounted on the print-circuit board, the second external terminals 21 have the same potentials (ground potential). Being not directly connected to the SAW device chip 40, the second external terminals 21 also function as dummy terminals.

In the SAW device shown in FIGS. 1A through 1D, the ground patterns on the SAW device chip 40 are not directly connected to the second external terminals 19 that serve as the ground terminals of the package 100A. In the SAW device shown in FIGS. 2A through 2D, the ground patterns on the SAW device chip 40 are not directly connected to the second external terminals 21 that serve as the ground terminals of the package 100B. For this reason, the stopband attenuation, which is the electrical characteristics of a SAW device, cannot be sufficiently secured in both of the two comparative examples. Also, to connect the ground patterns on each SAW device to the metal portion 10A/10B of the package 100A/100B, the ground patterns need to be connected directly to the metal portion of the chip mounting surface with metal wires. However, the chip mounting surface might have some adhesive resin oozing out from the bonding area between the SAW device chip 40 and the package 100A/100B, and the reliability in the connection using the metal wires 50 might not be sufficiently high. Furthermore, when metal wires are connected to the chip mounting surface that is located at a lower height than the surface of the SAW device chip 40, the bonding tool and the metal wires interfere with the SAW device chip 40, resulting in an unreliable wire connection.

In view of the above facts, the present invention provides a small-sized, reliable electronic component and a package in which the metal portion is connected to the ground patterns on a chip such as a SAW device chip with metal wires, so that the electrical characteristics of the electronic component such as a SAW device can be improved. With the electronic component and the package, reliable wire-bonding can be easily performed. The following is a description of preferred embodiments of the present invention, with reference to the accompanying drawings.

(First Embodiment)

Figure 3A:
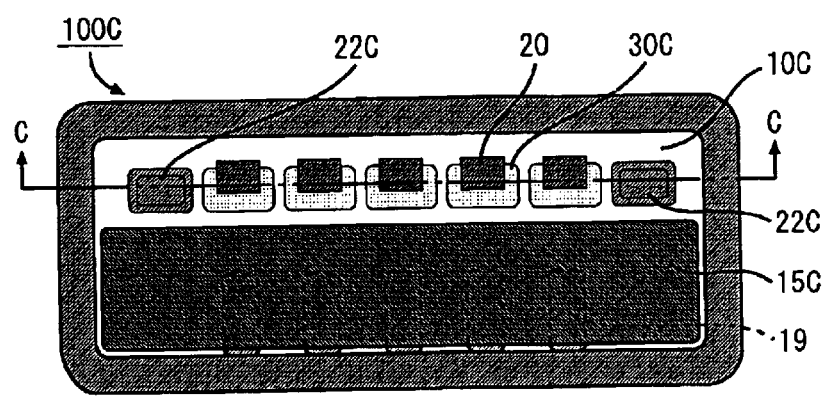
FIG. 3A is a plan view of the package of a SAW device in accordance with a first embodiment of the present invention.
Figure 3B:
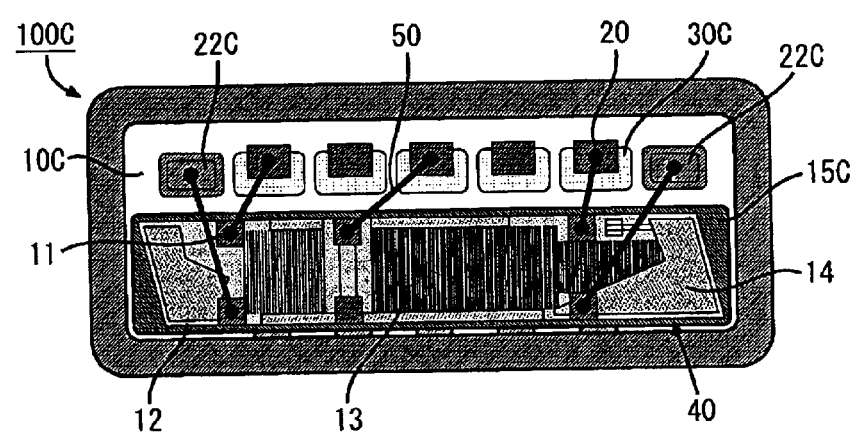
FIG. 3B is a plan view of the inside of the SAW device, seen through an outer lid.
Figure 3C:
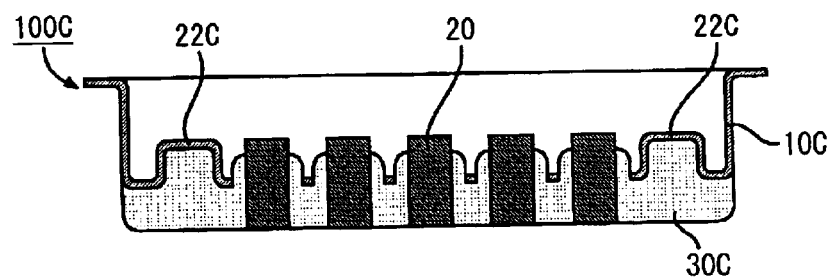
FIG. 3C is a section view of the SAW device, taken along the line C—C of FIG. 3A.

Referring now to FIGS. 3A through 3C, a first embodiment of the present invention will be described in detail. FIGS. 3A through 3C illustrate a SAW device in accordance with this embodiment. FIG. 3A is a plan view of a package 100C. FIG. 3B is a plan view of the inside of the SAW device, seen through a lid 60. FIG. 3C is a section view of the SAW device, taken along the line C—C of FIG. 3A. In FIGS. 3A through 3C, the same components as those shown in FIGS. 1A through 2D are denoted by the same reference numerals as those in FIGS. 1A through 2D.

As shown in FIGS. 3A through 3C, the SAW device in accordance with this embodiment is an electronic component that includes the package 100C and a SAW device chip 40 housed in the package 100C. The package 100C includes a metal portion 10C that is formed by pressing a metal, and an insulating portion 30C that is attached to the metal portion 10C through fusing. The SAW device further includes first external terminals 20 that are electrically connected to the SAW device chip 40 and are aligned and embedded in the insulating portion 30C, and a plate member 15C that supports the SAW device chip 40. The metal portion 10C has concave portions 19 that form second external terminals, and the plate member 15C is placed to cover the concave portions 19. The metal portion 10C has ground terminals 22C in the form of convexities that are placed to sandwich the aligned first external terminals 20. The ground terminals 22C are electrically connected to the ground patterns on the SAW device chip 40.

More specifically, the SAW device shown in FIGS. 3A through 3C includes the package 100C and the SAW device chip 40 that is hermetically sealed in the package 100C. The package 100C includes the metal portion 10C and the insulating portion 30C, and the SAW device chip 40 is housed in the inner cavity of the package 100C. The metal portion 10C is formed by pressing a metal. The metal portion 10C has a thickness of 50 μm, and forms the principal outer wall of the package 100C. The metal portion 10C also has the concave portions 19. Each of the concave portions 19 has the form of a concavity when seen from the inside of the package 100C, but has the form of a convexity when seen from the outside of the package 100C. Each of the concave portions 19 has a C-shaped section. The concave portions 19 are also formed by pressing the metal. The exterior of each of the concave portions 19 is flat so that the concave portions 19 form the connecting areas for external connections. The concave portions 19 serve as second external terminals. The second external terminals 19 are part of the package 100C, as well as part of the metal portion 10C. The metal portion 10C has the ground terminals 22C that are convexities formed by pressing the metal and are placed to sandwich the aligned first external terminals 20. The upper portion of each of the ground terminals 22C is flat in the direction of mounting the SAW device chip 40, and serves as a terminal that connects to the SAW device chip 40 with metal wires 50. The ground terminals 22C are linked to the second external terminals 19 via the metal portion 10C, and the ground terminals of the SAW device chip 40 are connected to the ground terminals 22C of the package 100C with the metal wires 50.

The terminals on the SAW device chip 40, the first external terminals 20, and the ground terminals 22C, are electrically connected with the metal wires 50. These connections are established through thermal compression or ultrasonic welding. To increase the reliability in the electric connection using the metal wires 50, it is preferable to arrange the inner connecting points between the first external terminals 20 and the ground terminals 22C on the same plane (at the same height) as the connecting points (or the terminals) of the SAW device chip 40. Here, the tolerable difference in height between the inner connecting points and the connecting points of the SAW device chip 40 should be within ±50 μm, which difference substantially means the same plane or height.

The ground terminals 22C are convexities that are formed from the metal portion 10C by pressing the metal, and insulating members integrally formed with the insulating portion 30C fill the concave portions formed at the rears of the terminals on the front side. With the insulating members filling the concave portions on the rear surfaces of the ground terminals 22C, the ground terminals 22C are prevented from being damaged by the weight and ultrasonic oscillation that are caused when the metal wires 50 are joined to the ground terminals 22C.

Figure 4:
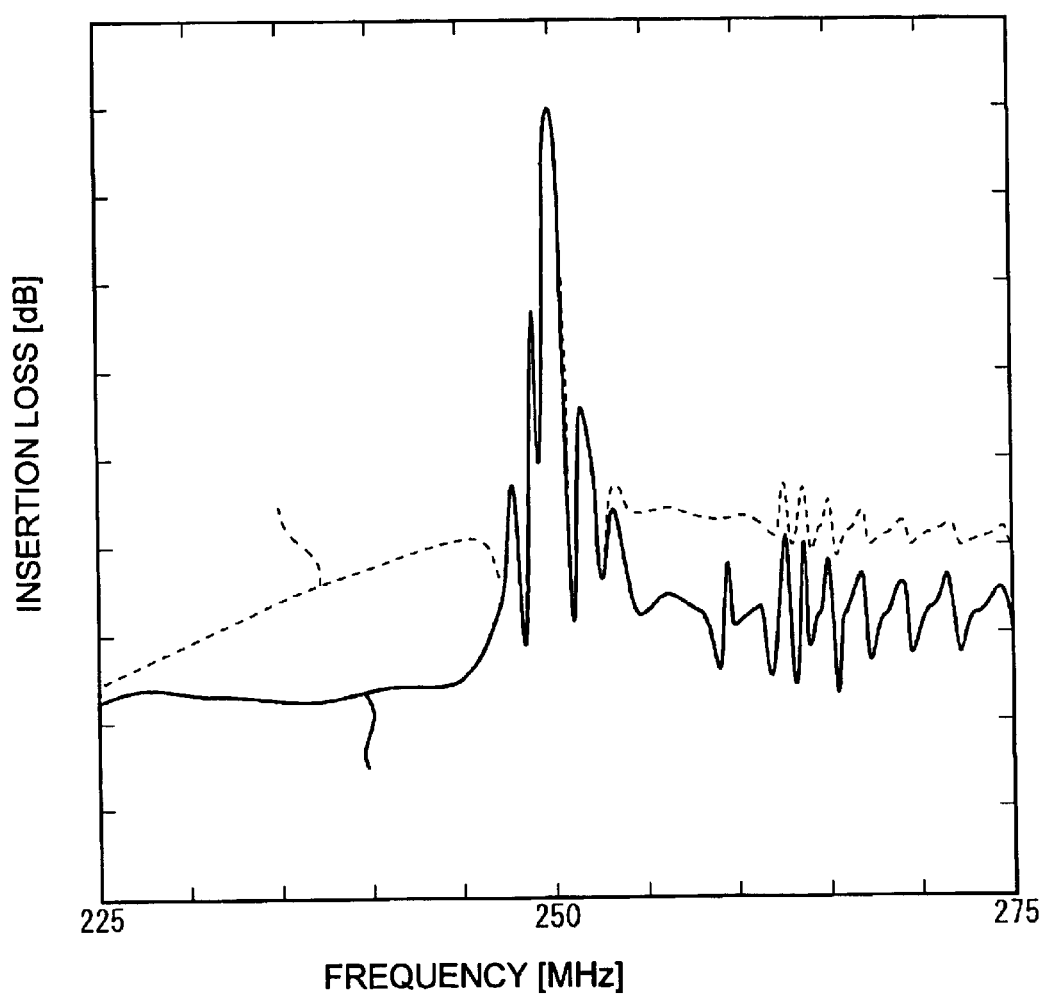
FIG. 4 is a graph showing the frequency characteristics of a SAW device that employs a 250 MHz band SAW filter as the SAW device chip in accordance with the first embodiment.

Referring now to FIG. 4, the electrical characteristics of the SAW device of this embodiment having the above described structure will be described. FIG. 4 shows the frequency characteristics of a SAW device that employs a 250 MHz band SAW filter as the SAW device chip 40 in accordance with this embodiment. In FIG. 4, the solid line indicates the frequency characteristics of the SAW device of this embodiment in which the terminals on the SAW device chip 40 are electrically connected to the first external terminals 20 and the ground terminals 22 with the metal wires 50. The broken line indicates the frequency characteristics of either of the two comparative examples in which the terminals on the SAW device chip 40 are not connected to the first external terminals 20 and the second external terminals 19/21. As is apparent from FIG. 4, the terminals on the SAW device chip 40 are electrically connected to the first external terminals 20 and the ground terminals 22C, so that the stop-band attenuation of the SAW device is improved by 10 dB or more. This effect can be obtained not only with a 250 MHz band filter but also with any of filters utilizing other various frequency bands that should be selected according to the purpose.

To connect the ground patterns on the SAW device to the metal portion 10C of the package 100C of this embodiment, the ground patterns on the SAW device need to be connected directly to the metal portion of the chip mounting surface with metal wires, as in the comparative examples. In this embodiment, however, the ground terminals 22C that are convexities formed by pressing part of the metal portion 10C of the package 100C can prevent defective connections with the metal wires 50 that might be caused by an adhesive resin oozing out from the die-bonding area between the SAW device chip 40 and the package 100C. Also, the ground terminals 22C that are in the form of convexities are arranged substantially at the same height as the SAW device chip 40, so that interference with the SAW device chip 40 by bonding tool and metal wires can be prevented. Thus, reliable wire-connecting can be performed.

(Second Embodiment)

Figure 5A:
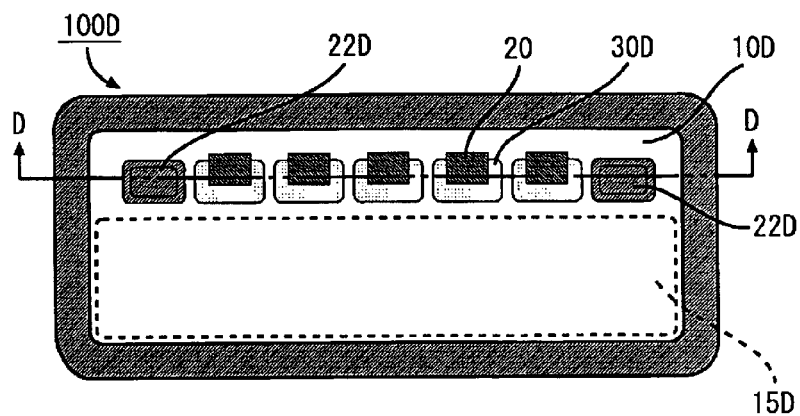
FIG. 5A is a plan view of the package of a SAW device in accordance with a second embodiment of the present invention.
Figure 5B:
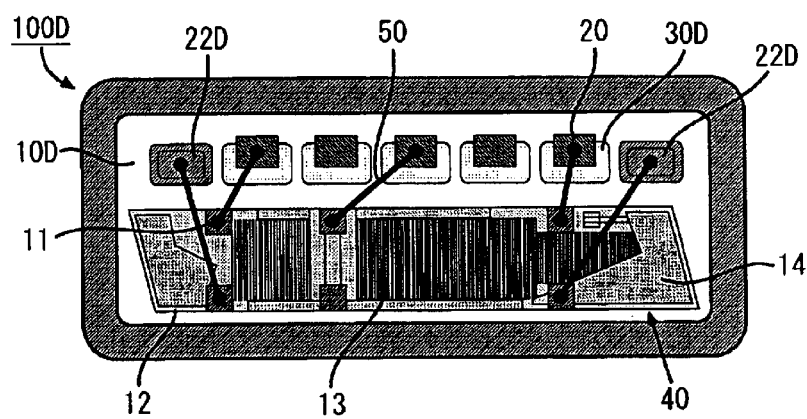
FIG. 5B is a plan view of the inside of the SAW device, seen through an outer lid.
Figure 5C:
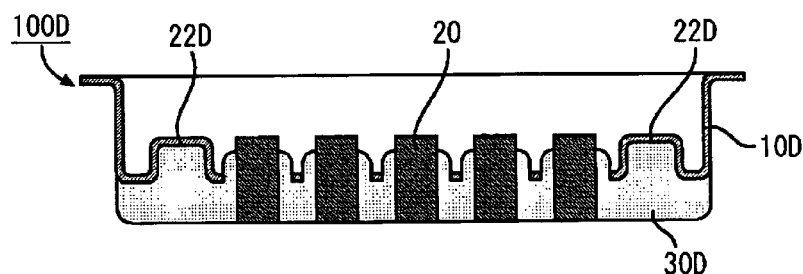
FIG. 5C is a section view of the SAW device, taken along the line D—D of FIG. 5A.

A second embodiment of the present invention will now be described in detail, with reference to the accompanying drawings. FIGS. 5A through 5C illustrate a SAW device in accordance with this embodiment. FIG. 5A is a plan view of a package 100D. FIG. 5B is a plan view of the inside of the SAW device, seen through a lid 60. FIG. 3C is a section view of the SAW device, taken along the line D—D of FIG. 5A. In FIGS. 5A through 5C, the same components as those shown in FIGS. 1A through 3C are denoted by the same reference numerals as those in FIGS. 1A through 3C.

The SAW device of this embodiment differs from the SAW device of the first embodiment in that the second external terminals are formed with separate members from the package, instead of the metal portion of the package, and in that the SAW device chip is mounted directly onto the metal portion of the package.

As shown in FIGS. 5A through 5C, the SAW device in accordance with this embodiment is an electronic component that includes the package 100D and a SAW device chip 40 housed in the package 100D. The package 100D includes a metal portion 10D that is formed by pressing a metal, and an insulating portion 30D that is attached to the metal portion 10D through fusing. The SAW device further includes first external terminals 20 that are electrically connected to the SAW device chip 40 and are aligned and embedded in the insulating portion 30D, and second external terminals 21 that are attached to the outer surface of the metal portion 10D (like the second external terminals 21 of the SAW device shown as a comparative example in FIGS. 2A through 2D). The SAW device chip 40 is die-mounted onto the inner surface of the metal portion 10D, and is placed to face the second external terminals 21. The metal portion 10D has ground terminals 22D in the form of convexities that are placed to sandwich the aligned first external terminals 20. The ground terminals 22D are electrically connected to the ground patterns on the SAW device chip 40.

More specifically, the SAW device shown in FIGS. 5A through 5C includes the package 100D and the SAW device chip 40 that is hermetically sealed in the package 100D. The package 100D includes the metal portion 10D and the insulating portion 30D, and the SAW device chip 40 is housed in the inner cavity of the package 100D. The metal portion 10D is formed by pressing a metal. The metal portion 10D has a thickness of 50 μm, and forms the principal outer wall of the package 100D. The metal portion 10D has a chip mounting portion 15D that is formed by pressing the metal. The chip mounting portion 15D has a flat outer surface onto which the second external terminals 21 are attached by welding, or the like. The second external terminals 21 are not connected directly to the SAW device chip 40, and function as the ground terminals of the package 100D. Each of the second external terminals 21 has an L-shaped section, and is electrically connected to the metal portion 10D at a joining point 71. When the SAW device is mounted on the print-circuit board, the second external terminals 21 have the same potentials (ground potential). Being not connected directly to the SAW device chip 40, the second external terminals 21 also function as dummy terminals.

The terminals on the SAW device chip 40, the first external terminals 20, and the ground terminals 22D, are electrically connected with the metal wires 50. These connections are established through thermal compression or ultrasonic welding. To increase the reliability in the electric connections using the metal wires 50, it is preferable to arrange the inner connecting points between the first external terminals 20 and the ground terminals 22D on the same plane (at the same height) as the connecting points (or the terminals) of the SAW device chip 40. Here, the difference in height between the inner connecting points and the connecting points of the SAW device chip 40 should be within ±50 µm.

The ground terminals 22D are convexities that are formed from the metal portion 10D by pressing the metal, and insulating members integrally formed with the insulating portion 30D fill the concave portions formed at the rears of the terminals on the front side. With the insulating members filling the concave portions on the rear surfaces of the ground terminals 22D, the ground terminals 22D are prevented from being damaged by the weight and ultrasonic oscillation that are caused when the metal wires 50 are joined to the ground terminals 22D.

With the above structure, the terminals on the SAW device chip 40 can be electrically connected to the first external terminals 20 and the ground terminals 22D. Thus, like the first embodiment, this embodiment can improve the stop-band attenuation of the SAW device by 10 dB or more (see FIG. 4).

To connect the ground patterns on the SAW device to the metal portion 10D of the package 100D of this embodiment, the ground patterns on the SAW device need to be connected directly to the metal portion of the chip mounting surface with metal wires, as in the comparative examples. In this embodiment, however, the ground terminals 22D that are convexities formed by pressing part of the metal portion 10D of the package 100D can prevent defective connections with the metal wires 50 that might be caused by an adhesive resin oozing out from the bonding area between the SAW device chip 40 and the package 100D. Also, the ground terminals 22D that are in the form of convexities are arranged substantially at the same height as the SAW device chip 40, so that interference with the SAW device chip 40 by bonding tool and metal wires can be prevented. Thus, reliable wire-connecting can be performed.

(Third Embodiment)

Figure 6A:
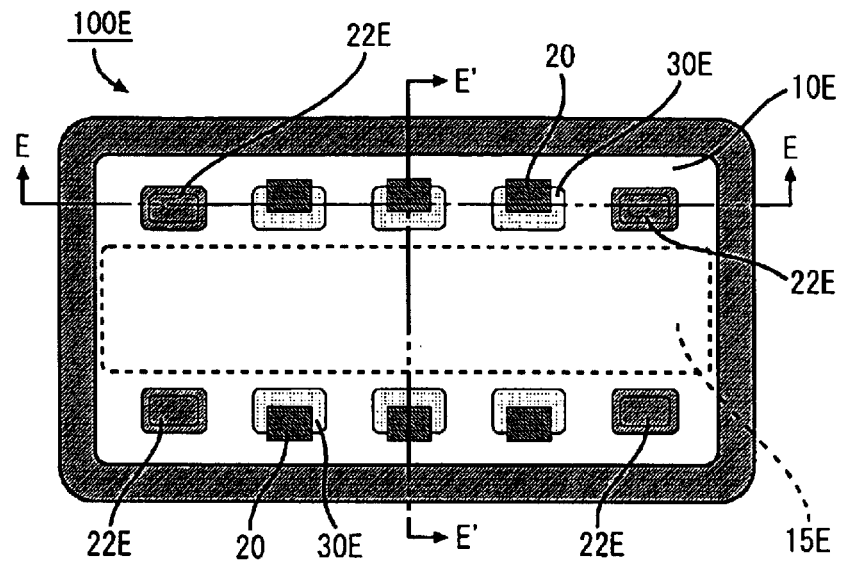
FIG. 6A is a plan view of the package of a SAW device in accordance with a third embodiment of the present invention.
Figure 6B:
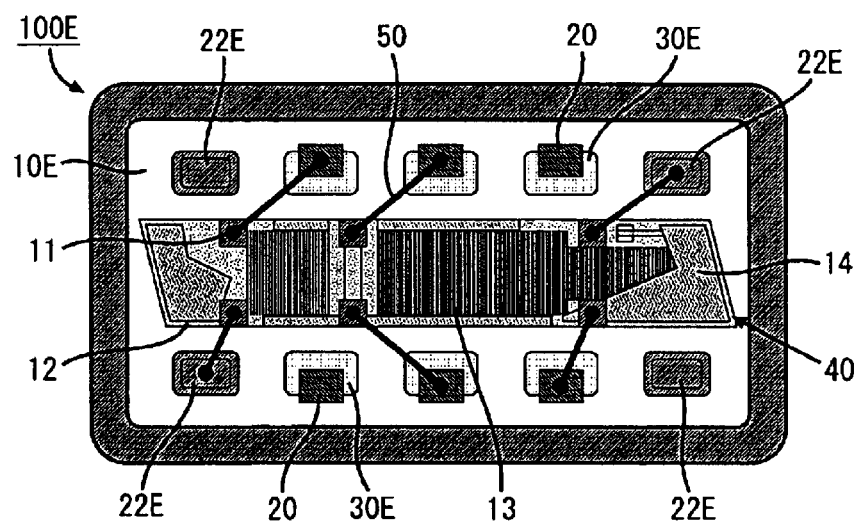
FIG. 6B is a plan view of the inside of the SAW device, seen through an outer lid.
Figure 6C:
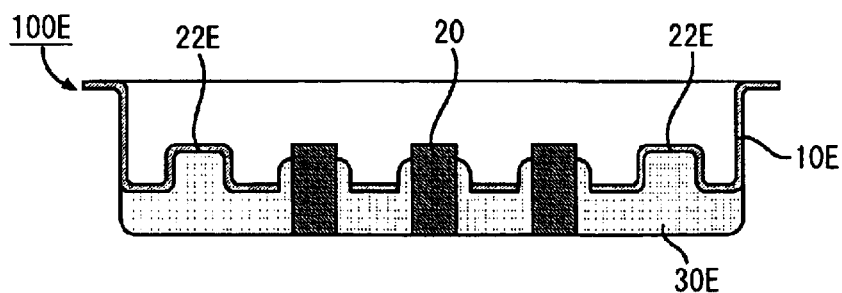
FIG. 6C is a section view of the SAW device, taken along the line E—E of FIG. 6A.
Figure 7:
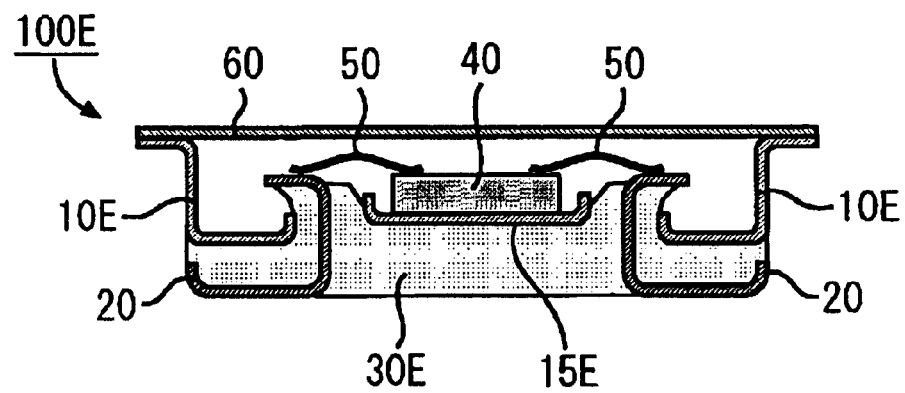
FIG. 7 is a section view of the SAW device, taken along the line E'—E' of FIG. 6A.

A third embodiment of the present invention will now be described in detail, with reference to the accompanying drawings. FIGS. 6A through 6C and FIG. 7 illustrate a SAW device in accordance with this embodiment. FIG. 6A is a plan view of a package 100E. FIG. 6B is a plan view of the inside of the SAW device, seen through a lid 60. FIG. 6C is a section view of the SAW device, taken along the line E—E of FIG. 6A. FIG. 7 is a section view of the SAW device, taken along the line E'—E' of FIG. 6A. In FIGS. 6A through 6C and FIG. 7, the same components as those shown in FIGS. 1A through 5C are denoted by the same reference numerals as those in FIGS. 1A through 5C.

The SAW device of this embodiment differs from the SAW devices of the first and second embodiments in that the first external terminals are arranged on both sides of the SAW device chip.

As shown in FIGS. 6A through 6C and FIG. 7, the SAW device in accordance with this embodiment is an electronic component that includes the package 100E and a SAW device chip 40 housed in the package 100E. The package 100E includes a metal portion 10E that is formed by pressing a metal, and an insulating portion 30E that is attached to the metal portion 10E through fusing. The SAW device further includes first external terminals 20 that are electrically connected to the SAW device chip 40 and are embedded in the insulating portion 30E. The first external terminals 20 of this embodiment are aligned on both sides of the SAW device chip 40. The metal portion 10E has ground terminals 22E in the form of convexities that are formed by pressing the metal and are placed to sandwich both of the two rows of first external terminals 20. The ground terminals 22E are electrically connected to the ground patterns on the SAW device chip 40.

More specifically, the SAW device shown in FIGS. 6A through 6C and FIG. 7 includes the package 100E and the SAW device chip 40 that is hermetically sealed in the package 100E. The package 100E includes the metal portion 10E and the insulating portion 30E, and the SAW device chip 40 is housed in the inner cavity of the package 100E. The metal portion 10E is formed by pressing a metal. The metal portion 10E has a thickness of 50 µm, and forms the principal outer wall of the package 100E. The metal portion 10E has a chip mounting portion 15E that is flat and formed by pressing the metal.

The terminals on the SAW device chip 40, the first external terminals 20, and the ground terminals 22E, are electrically connected with the metal wires 50. These connections are established through thermal compression or ultrasonic welding. To increase the reliability in the electric connections using the metal wires 50, it is preferable to arrange the inner connecting points between the first external terminals 20 and the ground terminals 22E on the same plane (at the same height) as the connecting points (or the terminals) of the SAW device chip 40. Here, the difference in height between the inner connecting points and the connecting points of the SAW device chip 40 should be within ±50 µm.

The ground terminals 22E are convexities that are formed from the metal portion 10E by pressing the metal, and insulating members integrally formed with the insulating portion 30E fill the concave portions formed at the rears of the terminals on the front side. With the insulating members filling the concave portions on the rear surfaces of the ground terminals 22E, the ground terminals 22E are prevented from being damaged by the weight and ultrasonic oscillation that are caused when the metal wires 50 are joined to the ground terminals 22E.

With the above structure, the terminals on the SAW device chip 40 can be electrically connected to the first external terminals 20 and the ground terminals 22E. Thus, like the first embodiment, this embodiment can improve the stop-band attenuation of the SAW device by 10 dB or more (see FIG. 4).

To connect the ground patterns on the SAW device to the metal portion 10E of the package 100E of this embodiment, the ground patterns on the SAW device need to be connected directly to the metal portion of the chip mounting surface with metal wires, as in the comparative examples. In this embodiment, however, the ground terminals 22E that are convexities formed by pressing part of the metal portion 10E of the package 100E can prevent defective connections with the metal wires 50 that might be caused by an adhesive resin oozing out from the bonding area between the SAW device chip 40 and the package 100E. Also, the ground terminals 22E that are in the form of convexities are arranged substantially at the same height as the SAW device chip 40, so that interference with the SAW device chip 40 by bonding tool and metal wires can be prevented. Thus, reliable wire-connecting can be performed.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An electronic component comprising:
   a package that includes a metal portion formed by pressing a metal, and an insulating portion attached to the metal portion through fusing;
   a chip housed in the package;
   first external terminals that are electrically connected to the chip with metal wires, and are partially embedded in the insulating portion; and
   ground terminals that are convexities of the metal portion and are electrically connected to the chip with metal wires,
   connecting points between the first external terminals and the chip being located at the same height as connecting points between the ground terminals and the chip.

2. The electronic component as claimed in claim 1, further comprising an insulating material that fills concavities formed on the backsides of the connecting points of the ground terminals.

3. The electronic component as claimed in claim 2, wherein the insulating material is glass or glass ceramics.

4. The electronic component as claimed in claim 1, wherein the metal portion is electrically connected to the chip, and includes concave portions that serve as second external terminals of the package.

5. The electronic component as claimed in claim 4, further comprising a plate member that supports the chip on the back surface thereof, and is fixed to the metal portion so as to cover the concave portions.

6. The electronic component as claimed in claim 5, wherein the plate member is made of a metal.

7. The electronic component as claimed in claim 1, wherein the insulating portion is made of glass or glass ceramics.

8. The electronic component as claimed in claim 1, further comprising second external terminals that are attached to an outer surface of the metal portion, and are electrically connected to the chip.

9. The electronic component as claimed in claim 1, wherein the metal portion is made of cold-rolled steel, 42-alloy, or Kovar.

10. The electronic component as claimed in claim 1, wherein the chip is a surface acoustic wave device chip that includes interdigital transducers formed on a piezoelectric substrate.

11. A package comprising:
    a metal portion formed by pressing a metal;
    an insulating portion that is attached to the metal portion through fusing;
    first external terminals that are partially embedded in the insulating portion; and
    ground terminals that are convexities of the metal portion,
    inner connecting points of the first external terminals being located at the same height as inner connecting points of the ground terminals.

* * * * *